(12) United States Patent
Zlotnik

(10) Patent No.: US 12,416,959 B2
(45) Date of Patent: Sep. 16, 2025

(54) TEMPERATURE-BASED VOLTAGE MANAGEMENT

(71) Applicant: Micron Technology, Inc., Boise, ID (US)

(72) Inventor: Leon Zlotnik, Camino, CA (US)

(73) Assignee: Micron Technology, Inc., Boise, ID (US)

( * ) Notice: Subject to any disclaimer, the term of this patent is extended or adjusted under 35 U.S.C. 154(b) by 182 days.

(21) Appl. No.: 17/891,331

(22) Filed: Aug. 19, 2022

(65) Prior Publication Data

US 2024/0061485 A1    Feb. 22, 2024

(51) Int. Cl.
*G06F 1/28* (2006.01)
*G11C 5/14* (2006.01)

(52) U.S. Cl.
CPC ............... *G06F 1/28* (2013.01); *G11C 5/147* (2013.01)

(58) Field of Classification Search
CPC ........ G06F 1/28; G06F 1/3275; G06F 1/3296; G06F 1/206; G11C 5/147; G11C 7/04
See application file for complete search history.

(56) References Cited

U.S. PATENT DOCUMENTS

| | | |
|---|---|---|
| 3,430,070 A | 2/1969 | Marshall, Jr. et al. |
| 5,179,295 A | 1/1993 | Mattison et al. |
| 5,767,717 A | 6/1998 | Schorn et al. |
| 8,461,869 B1 * | 6/2013 | Rahim ............ H03K 19/17784 326/47 |
| 9,599,672 B2 | 3/2017 | Abhishek et al. |
| 2006/0294282 A1 | 12/2006 | Warner |

* cited by examiner

*Primary Examiner* — Paul Yen
(74) *Attorney, Agent, or Firm* — Brooks, Cameron & Huebsch, PLLC

(57) ABSTRACT

A method includes receiving signaling indicative of a temperature of a circuit portion area of a memory sub-system and receiving signaling indicative of a voltage or a current of the circuit portion area of the memory sub-system. The method further includes generating, based on the signaling indicative of temperature of the circuit portion area and the signaling indicative of the voltage or the current of the circuit portion area, a voltage management control signal and transferring the voltage management control signal to a voltage regulator of the memory sub-system. The method further includes operating the voltage regulator in response to receipt of the voltage management control signal to generate a voltage signal.

23 Claims, 5 Drawing Sheets

TEMPERATURE-BASED VOLTAGE MANAGEMENT

TECHNICAL FIELD

Embodiments of the disclosure relate generally to digital logic circuits, and more specifically, relate to temperature-based voltage management.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
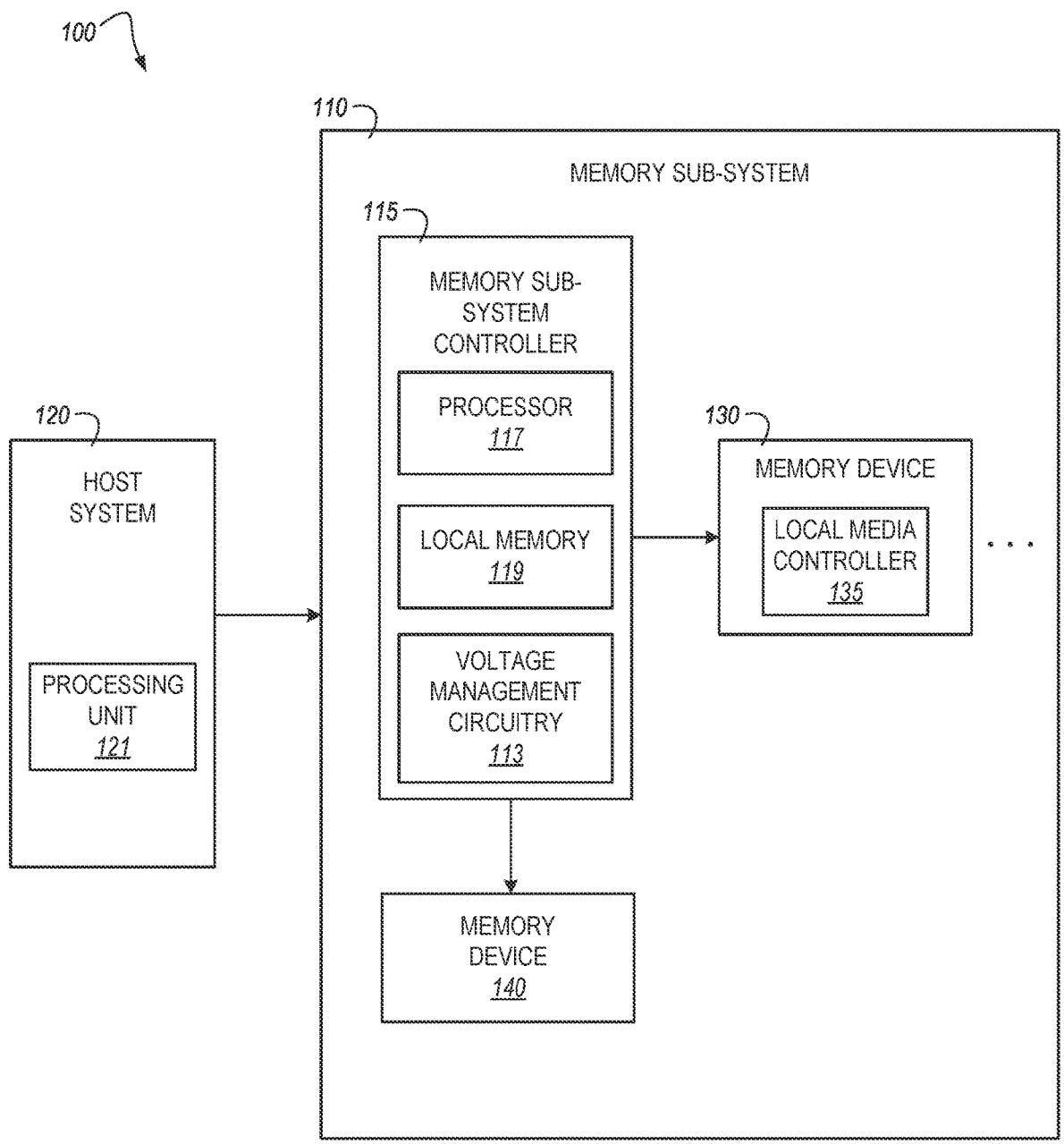
FIG. 1 illustrates an example computing system that includes a memory sub-system in accordance with some embodiments of the present disclosure.

Aspects of the present disclosure are directed to temperature-based voltage management and, in particular, to memory sub-systems that provide temperature-based voltage management. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

Power in such memory sub-systems can be provided by various power supplies, which generally supply a voltage signal or current signal to one or more voltage regulators. The voltage regulator(s) then seek to maintain a stable output voltage and provide the stable output voltage to various components of the memory sub-system. Generally, the voltage regulator(s) are able to maintain and provide the stable output voltage under normal operating conditions of the memory sub-system; however, due to various factors such as process variation in components of the memory sub-system, operational conditions of the memory sub-system, and/or sudden changes in loads experienced by components during operation of the memory sub-system, among other factors, the voltage regulator(s) can sometimes temporarily fail to supply a stable voltage to components of the memory sub-system.

For example, a voltage drop (e.g., IR drop) can occur as a voltage signal traverses signal paths in a memory sub-system. In some instances, the voltage drop can lead to scenarios in which a voltage regulator is unable to provide an accurate stable voltage to one or more components of the memory sub-system. In order to remedy such scenarios, some conventional approaches may increase the size of the voltage regulator(s) to utilize larger, more powerful voltage regulators to supply higher than theoretically necessary voltages across a signal path to ensure that adequate voltage is provided to the components of the memory sub-system. However, increasing the power output of the voltage regulator can be costly in terms of power consumption in the memory sub-system, heat generation in the memory sub-system, and/or space (e.g., real estate) consumed in the memory sub-system. These issues can be further exacerbated in certain form factor memory sub-systems, particularly as memory sub-system development trends toward smaller devices that feature densely packed components.

Further, as components (e.g., silicon chips, dice, packages, etc.) of the memory sub-system are operated, the temperatures of such components can be altered (e.g., can increase or can decrease). As the temperature of these components increases, an amount of power consumed in operating such components generally increases as well. Some approaches however fail to account for the changes in temperature associated with operation of these components and tend to apply an unchanging voltage value (e.g., constant voltage value) to these components. Although this may simplify voltage management in the memory sub-system, higher than necessary power may be consumed during operation of the memory sub-system in such approaches.

In order to address these and other deficiencies of current approaches, embodiments of the present disclosure provide voltage management circuitry that receives information from various voltage sensors, current sensors, and/or temperature sensors in the memory sub-system, as well as information corresponding to quality characteristics of one or more components (e.g., chips, dice, etc.) of the memory sub-system and sends signals to the voltage regulator to cause the voltage regulator to output a modified voltage. As used herein, a "modified voltage" generally refers to a voltage signal (e.g., generated by the voltage regulator) that provides a different voltage level than a voltage signal generated prior to processing of signals from the voltage management circuitry. For example, if the voltage regulator is generating an initial voltage signal that corresponds to X volts during normal operation and the voltage regulator receives the signals from the voltage management circuitry indicating that the voltage regulator is to generate a voltage signal that corresponds to Y volts, the modified voltage can be the voltage Y.

The modified voltage can be greater than the initial voltage (e.g., Y>X) or the modified voltage can be less than the initial voltage (e.g., Y<X). For example, to remediate a detected voltage overshoot (e.g., a situation in which too great of a voltage is supplied to the memory sub-system), the modified voltage can be less than the initial voltage. Similarly, to remediate a voltage undershoot (e.g., a situation in which too small of a voltage is supplied to the memory sub-system), the modified voltage can be less than the initial voltage.

As mentioned above, the voltage management circuitry can receive information corresponding to quality characteristics of one or more silicon chips, dice, components, etc. or constituent components of the memory sub-system. As used herein, the term "quality characteristics," particularly with respect to silicon chips and dice of the memory sub-system, generally refer to physical characteristics of such silicon chips and dice that can be determined based on a location on a wafer at which the silicon chips and dice were fabricated. As an example, because manufacturing process variation can lead to silicon chips and/or dice that are fabricated at the edge of the wafer having generally lower quality characteristics than those silicon chips and dice that are fabricated closer to the center of the wafer (or, vice-versa), embodiments herein allow for the location of the silicon chips and dice with respect to the wafer during fabrication to be used in connection with determining a value of a modified voltage signal to be applied to the memory sub-system by the voltage regulator.

Further, such quality characteristics can vary from wafer-to-wafer. For example, due to inherent inconsistencies between different wafers, the quality characteristics of one wafer can be different than those of a different wafer, even at the same location for each of the wafers. In general, the quality characteristics of the fabricated silicon chips and/or dice can vary more from wafer-to-wafer than the quality characteristics of the fabricated silicon chips and/or dice that are manufactured on a same wafer. Accordingly, the quality characteristics described herein can account for the variations between silicon chips and/or dice that are fabricated on different wafers to provide the advantages of the disclosure described herein.

For example, because a supply voltage provided by a voltage regulator can change non-uniformly and/or based on the quality characteristics of different components of a memory sub-system, embodiments of the present disclosure remediate timing and/or power anomalies that can occur as a result of temperature inversion, dynamic power distribution, leakage power distribution, and/or localize IR drops, among other phenomena. In general, because the memory sub-system (or components thereof) tend to consume the highest power at the highest temperatures, aspects of the present disclosure allow for a voltage signal (e.g., a supply voltage generated by the voltage regulator(s)) to be attenuated in proportion to a determined temperature of the components of the memory sub-system. This can allow for the power consumption of such components to be reduced, thereby increasing overall performance of the memory sub-system.

In some embodiments, the voltage management circuitry can be operated as described herein to reduce an amount of power consumed by various components of the memory sub-system while still providing an adequate amount of voltage or current to maintain functionality of the components of the memory sub-system. In particular, although power consumption in a memory sub-system tends to increase exponentially as the temperature of the silicon chips, dice, and/or components increase, such silicon chips, dice, and/or components may still fully function if the voltage or current is reduced (e.g., trimmed). Embodiments of the present disclosure exploit this phenomenon by providing a modified voltage to silicon chips, dice, and/or components of the memory sub-system based on a determined temperature of the silicon chips, dice, and/or components (among other information) to reduce power consumption in the memory sub-system.

By utilizing voltage management circuitry that receives information from various voltage sensors, current sensors, and/or temperature sensors in the memory sub-system, as well as information corresponding to quality characteristics of one or more silicon chips, dice, components, etc. of the memory sub-system, to send signals to the voltage regulator to cause the voltage regulator to output a modified voltage, voltage compensation in accordance with the present disclosure can be provided only as needed (e.g., in response to signaling generated by the voltage management circuitry). That is, by utilizing embodiments of the present disclosure, voltage compensation to provide a voltage boost (or reduction) or a current boost (or reduction) to components of the memory sub-system as needed, thereby yielding power savings (e.g., a reduction in power consumed by the memory sub-system) and, accordingly, an improvement to the memory sub-system, in comparison to the approaches described above. In addition, heat generation in the memory sub-system is reduced in comparison to the approaches described above thereby reducing the quantity and/or size of thermal dissipation components in the memory sub-system thereby yielding further improvements to the memory sub-system. Further, overall performance of a memory sub-system which employs aspects of the disclosure is improved without the need for increased power consumption in contrast to previous approaches.

Further, embodiments herein for temperature phenomena that result from temperature inversion effects to be dynamically addressed. Traditionally, hotter temperatures of various circuit components generally resulted in a lower speed (e.g., processing speed, throughput, etc.). As two-digit nanometer technology became more widespread, various areas (e.g., physical corners of silicon chips, dice, etc.) of such silicon chips, dice, etc. trended to experience two areas (e.g., "corners") that were classified as being "slow" based on the temperature response associated therewith. That is, the hot and the cold "corners" of a silicon chip, die, etc. tended to behave in a manner characterized as "slow" in comparison to "fast" at temperatures that fell between the relatively "hot" and "cold" areas or corners. It is noted that these "slow" corners need not be equally "slow" (e.g., these corners do not necessarily exhibit a same speed) and can have different speeds (e.g., one of these corners can be slower than the other corner). However, embodiments of the present disclosure contemplate single digit nanometer technologies in which lower temperatures (e.g., "cold" areas) are characterized as "slow" in comparison to relatively "hotter" areas that are characterized as being faster than the colder temperature areas. In any case, embodiments herein seek to set an optimized voltage (e.g., the modified voltage generated by the voltage regulator) based on a detected and/or a determined temperature (e.g., the real temperature of the silicon chip, die, etc. during operation of a memory sub-system) and therefore do not generally rely on the inherent behaviors of the areas or corners of the silicon chips, dice, etc.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

In other embodiments, the voltage sensing circuit 100 can be deployed on, or otherwise included in a computing device such as a desktop computer, laptop computer, server, network server, mobile computing device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 includes a processing unit 121. The processing unit 121 can be a central processing unit (CPU) that is configured to execute an operating system. In some embodiments, the processing unit 121 comprises a complex instruction set computer architecture, such an x86 or other architecture suitable for use as a CPU for a host system 120.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via the same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include voltage management circuitry 113. Although not shown in FIG. 1 so as to not obfuscate the drawings, the voltage management circuitry 113 can include various circuitry to facilitate aspects of the disclosure described herein. In some embodiments, the voltage management circuitry 113 can include special purpose circuitry in the form of an ASIC, FPGA, state machine, hardware processing device, and/or other logic circuitry that can allow the voltage management circuitry 113 to orchestrate and/or perform operations to provide dynamic voltage compensation, particularly with respect to a system-on-chip, in accordance with the disclosure. In some embodiments, the voltage management circuitry 113 can comprise a portion of voltage regulation circuitry (e.g., the voltage regulation circuitry 255/355 illustrated in FIG. 2 and FIG. 3, herein) that further includes a voltage regulator (e.g., the voltage regulator 252/352 illustrated in FIG. 2 and FIG. 3, herein).

In some embodiments, the memory sub-system controller 115 includes at least a portion of the voltage management circuitry 113. For example, the memory sub-system controller 115 can include a processor 117 (processing device) configured to execute instructions stored in local memory 119 for performing the operations described herein. In some embodiments, the voltage management circuitry 113 is part of the host system 110, an application, or an operating system. The voltage management circuitry 113 can be resident on the memory sub-system 110 and/or the memory sub-system controller 115. As used herein, the term "resident on" refers to something that is physically located on a particular component. For example, the voltage management circuitry 113 being "resident on" the memory sub-system 110, for example, refers to a condition in which the hardware circuitry that comprises the voltage management circuitry 113 is physically located on the memory sub-system 110. The term "resident on" may be used interchangeably with other terms such as "deployed on" or "located on," herein.

Figure 2:
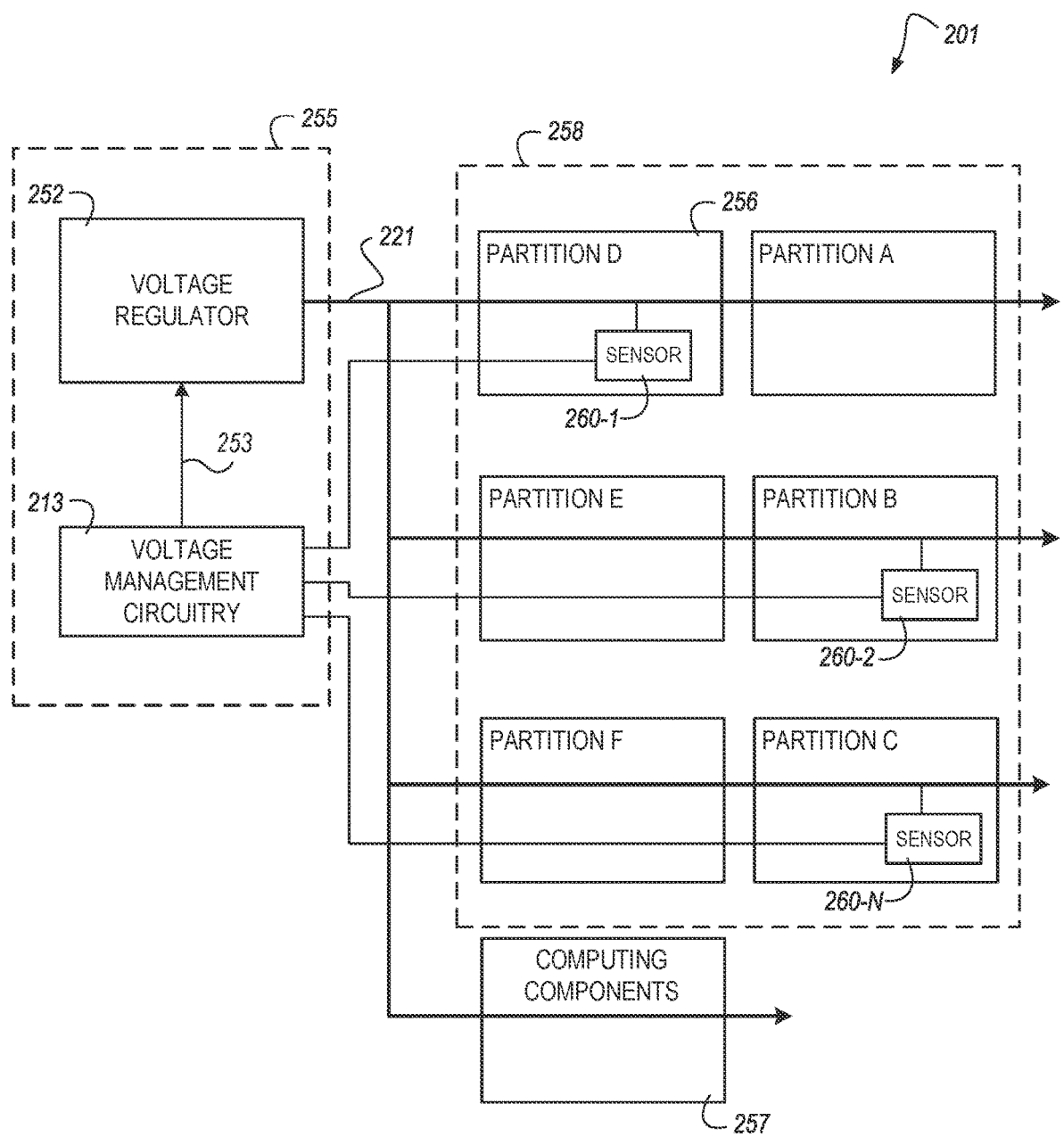
FIG. 2 illustrates an example of a temperature-based voltage management system in accordance with some embodiments of the present disclosure.

FIG. 2 illustrates an example of a temperature-based voltage management system 201 in accordance with some embodiments of the present disclosure. The example system 201, which can be referred to in the alternative as an "apparatus," includes voltage regulation circuitry 255, which includes a voltage regulator 252 and voltage management circuitry 213. The voltage regulator 252 is coupled to a voltage signal line 221 (e.g., a rail to provide a power supply signal or "supply voltage signal" to one or more electrical components, such as the circuit portion areas 256 and/or the computing components 257). The voltage signal line 221 can be split into one or more voltage supply lines that supply voltage to the circuit portion areas 256 and the computing components 257 of the system 201.

As the voltage signal generated by the main voltage regulator 252 traverses the voltage signal line 221 and provides voltage to the circuit portion areas 256 and/or the computing components 257, temperatures associated with the circuit portion areas 256 and/or the computing components 257 can be altered. For example, the circuit portion areas 256 and/or the computing components 257 can experience higher temperatures in the presence of voltage signals as opposed to in the absence of voltage signals. Further, the longer (e.g., the more prolonged operation of the memory sub-system becomes) the circuit portion areas 256 and/or the computing components 257 are supplied with such voltage signals, the higher the temperatures of the circuit portion areas 256 and/or the computing components 257 can become.

As mentioned above, as the temperature of the circuit portion areas 256 and/or the computing components 257 increases, the amount of power supplied to the circuit portion areas 256 and/or the computing components 257 generally increases, particularly in approaches that operate using voltage signals having a fixed voltage value. In order to alleviate the tendency towards increased power consumption in such scenarios, the sensor circuits 260-1, 260-2 to 260-N (generally referred to as "sensors circuits 260") can monitor the temperature of the circuit portion areas 256 and/or the computing components 257 to determine relatively instantaneous temperatures associated with each respective circuit portion area 256 and/or computing component 257.

Further, as the voltage signal generated by the main voltage regulator 252 traverses the voltage signal line 221, the magnitude of the voltage signal can be reduced, e.g., can experience an IR drop and/or a voltage drop. Accordingly, under some conditions, a "global voltage" signal (e.g., the voltage signal on the rail 221 prior to being split into different voltage supply lines) can have a greater magnitude (e.g., correspond to a larger voltage) than a "local voltage" signal (e.g., the voltage signal by the time it reaches the computing components 257). When the magnitude of the voltage signal is decreased, for example due to an IR drop, an increase in a current associated with the voltage signal can be detected using the sensor circuits 260. Conversely, when the magnitude of the voltage signal is increased, a decrease in the current associated with the voltage signal can be detected using the sensor circuits 260. In some embodiments, the sensor circuits 260 can be voltage sensors that are configured to detect voltages and/or changes in voltages in the system 201. Embodiments are not so limited, however, and in some embodiments, the sensor circuits 260 can be current sensors that are configured to detect currents and/or changes in currents in the system 201, among other possibilities are contemplated within the scope of the disclosure.

In addition, the circuit portion areas 256 and/or computing components 257 can exhibit different behaviors based on quality characteristics (e.g., the quality characteristics 366/367 illustrated in FIG. 3, herein) associated therewith. For example, due to process variations in manufacture of the circuit portion areas 256 and/or the computing components 257, some of the circuit portion areas 256 and/or the computing components 257 perform more "ideally" (i.e., as theoretically expected within operational constraints) than other circuit portion areas 256 and/or the computing components 257. Further, during manufacture of a memory sub-system in which the circuit portion areas 256 and/or computing components 257 are deployed, cost (or other manufacturing) concerns may dictate that circuit portion areas 256 and/or computing components 257 that are known to exhibit less than ideal quality characteristics are selected for deployment in the memory sub-system. Accordingly, by taking the quality characteristics of the circuit portion areas 256 and/or the computing components 257 into account when providing the modified voltage signals to the system 201, as described herein, it is possible to correct for, or, at minimum, mitigate adverse effects to performance of the system 201 that may arise from varying quality characteristics of the circuit portion areas 256 and/or the computing components 257.

In FIG. 2, the system 201 includes a circuit area 258 that includes a number of circuit portion areas 256 (e.g., partitions A-F) that have power supplied thereto via the main voltage regulator 252 through voltage supply lines coupled to the voltage supply line 221. The circuit portion areas 256 can be logic blocks that can include various hardware that form one or more cores (e.g., "intellectual property (IP) cores"). As used herein, a "core" or "IP core" generally refers to one or more blocks of data and/or logic that form constituent components of an application-specific integrated circuit or field-programmable gate array. The circuit portion areas can be designed, built, and/or otherwise configured to perform specific tasks and/or functions within the systems described herein. In some embodiments, the main voltage regulator 252 and/or the voltage management circuitry 213 can take an action (or cause an action to be taken) to track, limit, adjust or manipulate the voltage signals applied to the voltage signal line 221 and/or the voltage supply lines coupled to the voltage signal line 221 to provide voltage manipulation to the circuit portion areas 256.

As shown in FIG. 2, the circuit portion areas 256 can include sensor circuits 260. The sensor circuits 260 can include various hardware circuitry and/or circuitry components to detect voltage levels and/or current levels applied to the circuit portion areas 256 and/or the computing components 257 via the voltage signal line 221 and/or the voltage supply lines coupled to the voltage signal line 221. In addition, the sensor circuits 260 can detect thermal characteristics (e.g., temperatures) of the circuit portion areas 256 and/or the computing components 257 during operation of the circuit portion areas 256 and/or the computing components 257.

The sensor circuits 260 can be configured to transfer information indicative of a change in the current or the voltage, or both, associated with the voltage signal line 221 and/or the voltage supply lines coupled to the voltage signal line 221 to the voltage management circuitry 213. Similarly, the sensor circuits 260 can be configured to transfer information indicative of the thermal characteristics (e.g., a temperature) of the circuit portion areas 256 and/or the computing components 257. In response to receipt of such signaling, the voltage management circuitry 213 can control application of voltage signaling from the voltage regulator 252 to regulate a voltage signal applied to the voltage signal line 221.

The sensor circuit(s) 260 described herein include various circuit components (e.g., delay circuits, detector circuits, etc.) that can allow for instantaneous voltages and/or currents within the temperature-based voltage management system 201 to be determined. The sensor circuits 260 can include a first oscillator circuit (e.g., a free-running oscillator) that is powered from a rail of the voltage regulator 252 (e.g., a rail of a voltage regulator 252 that is local to the temperature-based voltage management system 201 and/or provides a measured voltage that may or may not be coupled to a main power supply of the temperature-based voltage management system 201. In such embodiments, the oscillator circuit can serve as a voltage and/or current sensor that is part of the sensor circuit(s) 260. The sensor circuits 260 can further include a second oscillator circuit (e.g., a reference oscillator or delay circuit) that is powered from a separate voltage supply (e.g., a different voltage regulator that provides a stable voltage that is characterized by low noise and/or low voltage fluctuation to the temperature-based voltage management system 201.

Frequency differences between the oscillator circuits can be compared to determine an instantaneous sense voltage value that corresponds to the actual sensed voltage at a particular moment in time of the temperature-based voltage management system 201 associated with the sensor circuit(s) 260. In addition, a phase difference between one or more of the oscillator circuits and at least one delay circuit can be compared to determine an instantaneous sense voltage value that corresponds to the actual sensed voltage at a particular moment in time of the temperature-based voltage management system 201 and/or components thereof. In the case of compared frequencies, a difference in the compared frequencies indicates that oscillators are subjected to differing voltages, while in the case of the phase associated with a signal from the oscillator being compared to the delay circuit, a phase difference may be detected with the oscillator and the delay circuit are subjected to differing voltage. By allowing for instantaneous (or near-instantaneous) voltage sensing and/or current sensing using the sensor circuits 260, electrical signals, such as voltages and/or currents, can be tracked, limited, adjusted, and/or manipulated to dynamically alter power consumption and/or noise in the temperature-based voltage management system 201 in particular in automated power management systems.

In some embodiments, the sensor circuit(s) 260 (e.g., voltage tracking circuit(s), current tracking circuit(s), etc.) described herein can include various circuit components (e.g., delay lines, phase detectors, control circuits, etc.) that can allow for accurate and timely (e.g., instantaneous or near-instantaneous) detection of voltages, currents, or other signaling associated with a SoC, ASIC, FPGA, or other such hardware circuitry associated with the temperature-based voltage management system 201 and/or components coupled thereto. The sensor circuit(s) 260 can include multiple delay line blocks that are coupled to a phase detector (PD) delay line block. The PD delay line block can be coupled via taps to phase detection circuitry that can include multiple phase detector circuits (e.g., flip-flops). As used herein, the term "tap" generally refers to a contact point or physical connection between one or more components. The phase detection circuitry can be coupled to a controller (e.g., the voltage management circuitry 213) that can determine an "actual" or measured voltage or associated current present in a system that includes the sensor circuit(s) 260. In some embodiments, the sensor circuit(s) 260 can be used to determine an actual (e.g., measured) voltage or current associated with the SoC, ASIC, FPGA, or other such hardware circuitry.

In some embodiments, the sensor circuit(s) 260 can detect voltages, currents, or other signals based on multiple voltage and/or current measurements. For example, the detected voltages, currents, etc. can be determined using a coarse voltage measurement and a fine voltage measurement, among other possibilities. In embodiments in which a coarse voltage measurement and a fine voltage measurement are used to determine the measured voltage, information delay line blocks can be used to determine the coarse voltage measurement and information from phase detectors can be used to determine the fine voltage measurement, as described in more detail herein.

In addition, embodiments herein allow for a threshold voltage to be set for use by the sensor circuit(s) 260 and/or components coupled thereto. For example, a magnitude of a voltage signal generated by one or more voltage regulators can be set as an actual (e.g., measured) voltage for use by the voltage management circuitry 213 and/or components coupled thereto based on signals received from the sensor circuit 260. By comparing various parameters (e.g., delay line block characteristics, frequencies, phase shifts, etc.) that are determined by the components described herein (e.g., by the sensor circuits 260 and/or the voltage management circuitry 213, it is possible to determine an accurate actual (e.g., measured) operational voltage and use this operational voltage in order to manipulate dynamic power consumption and/or noise in the temperature-based voltage regulation system 201.

In some embodiments, the voltage management circuitry 213 can determine, based on signals received from the sensor circuits 260, voltages, currents, and/or temperatures of the circuit area portions 256 and/or of the computing components 257. Once the voltage management circuitry 213 determines the voltages, currents, and/or temperatures of the circuit area portions 256 and/or of the computing components 257, the voltage management circuitry 213 can transfer one or more signals (e.g., the voltage management control signal 253) to the voltage regulator 252 to cause the voltage regulator 252 to supply a modified voltage signal on the voltage signal line 221. In some embodiments, the voltage management control signals 253 can comprise digital signals that include information indicating an amount of voltage and/or current that is necessary to provide a reduction in power consumed by the circuit area portions 256 and/or the computing components 257 while maintaining a suitable voltage to be fed to the circuit area portions 256 and/or the computing components 257 to allow for operation of the circuit area portions 256 and/or the computing components 257, as described in more detail below.

In some embodiments, the temperature-based voltage regulation system 201 can be configured such that different temperatures, voltage thresholds, current thresholds, and/or different voltage and/or current amplitudes (e.g., different amounts of gain) can be applied to and detected by different sensor circuits 260. By allowing for different temperatures, voltage thresholds and/or different current thresholds to be detected by individual sensor circuits the temperature-based voltage regulation system 201 can provide additional benefits over merely controlling an overall or average voltage, current, and/or temperature detected by the sensor circuits 260. For example, in practice, some of the circuit portion areas 256 and/or some of the computing components 257 may exhibit characteristics that are more tolerant to varying voltages, currents, and/or temperatures than other circuit portion areas 256 and/or some of the computing components 257. In such scenarios, embodiments of the disclosure allow for the components of the temperature-based voltage regulation system 201 (e.g., the sensors circuits 260, the voltage management circuitry 213, and/or the voltage regulator 252, etc.) can determine and set signals indicative of a higher voltage threshold to comparatively more critical circuit portion areas 256 and/or computing components 257 (e.g., those circuit portion areas 256 and/or some of the computing components 257 that are more prone to errors and/or failures when the voltage signal is greater than or less than expected or greater than expected) and can determine and set signals indicative of a lower voltage threshold to comparatively less critical circuit portion areas 256 and/or computing components 257 (e.g., those circuit portion areas 256 and/or some of the computing components 257 that are less prone to errors and/or failures when the voltage signal is greater than or less than expected or greater than expected).

As an illustrative example, if one or more circuit portion areas 256 and/or computing components 257 have a voltage threshold of 0.77 V and one or more different circuit portion areas 256 and/or computing components 257 have a voltage threshold of 0.75 V, when a voltage level detected by a sensor circuit 260 that is monitoring the comparatively more critical circuit portion areas 256 and/or computing components 257 and a voltage level detected by a sensor circuit 260 that is monitoring the comparatively less critical circuit portion areas 256 and/or computing components 257 both detect a voltage of 0.76 V, the voltage 0.77 V can be considered to be the worst voltage drop and can consequently be reported to the voltage management circuitry 213.

As will be appreciated, these non-limiting voltage values can correspond to temperatures of the circuit portion areas 256 and/or the computing components 257. For example, the voltage threshold of 0.77 V can correspond to a temperature threshold of one or more of the circuit portion areas 256 and/or the computing components 257 that is a higher temperature threshold than circuit portion areas 256 and/or the computing components 257 that have the voltage threshold of 0.75 V corresponding to a same determined temperature. In such embodiments, when a temperature corresponding to a voltage level detected by a sensor circuit 260 that is monitoring the comparatively more critical circuit portion areas 256 and/or computing components 257 and a temperature corresponding to a voltage level detected by a sensor circuit 260 that is monitoring the comparatively less critical circuit portion areas 256 and/or computing components 257 both detect a temperature corresponding to a voltage of 0.76 V, the temperature corresponding to the voltage 0.77 V can be considered to be the most critical and can correspond to a highest temperature and can consequently be reported to the voltage management circuitry 213.

In some embodiments, information corresponding to temperatures (e.g., temperature of the circuit portion areas 256 and/or the computing component(s) 257) can be reported to the voltage management circuitry 213 based on a criticality (e.g., a susceptibility to temperature fluctuations) of such of such components regardless of voltages and/or currents applied to the circuit portion areas 256 and/or the computing component(s) 257. For example, some of the circuit portion areas 256 and/or the computing component(s) 257 may experience higher temperatures and therefore may be deemed more critical than other circuit portion areas 256 and/or the computing component(s) 257 regardless of the voltage(s) applied thereto. Accordingly, embodiments herein allow for information related to these temperatures to be reported to the voltage management circuitry 213. Such information can be processed by the voltage management circuitry 213 and can be used in generating the voltage management control signal 253.

Similarly, information corresponding to voltage levels (e.g., voltage values applies to the circuit portion areas 256 and/or the computing component(s) 257) can be reported to the voltage management circuitry 213 based on a criticality (e.g., a susceptibility to voltages above a voltage threshold) of such of such components regardless of the temperature experienced by the circuit portion areas 256 and/or the computing component(s) 257. For example, some of the circuit portion areas 256 and/or the computing component(s) 257 may experience higher voltages and therefore may be deemed more critical than other circuit portion areas 256 and/or the computing component(s) 257 regardless of the temperature(s) experienced thereby. Accordingly, embodiments herein allow for information related to these voltage values to be reported to the voltage management circuitry 213. Such information can be processed by the voltage management circuitry 213 and can be used in generating the voltage management control signal 253.

In other embodiments, the temperature-based voltage regulation system 201 can be configured such that a relative weight of temperatures, voltages and/or currents required by different circuit portion areas 256 and/or different computing components 257 can be considered by the temperature-based voltage regulation system 201 in providing the benefits of the present disclosure. For example, two circuit portion areas 256 and/or two computing components 257 can have a same targeted temperature and/or voltage (after an inherent IR drop is accounted for) but one of two circuit portion areas 256 and/or two computing components 257 may be more sensitive to effects of the temperature, IR drop and/or voltage drop. For instance, scenarios may arise in which both of the two circuit portion areas 256 and/or both of the two computing components 257 require 0.75 V for operation but one of the two circuit portion areas 256 and/or the two computing components 257 can still operate with a voltage of 0.73 V while the other of the two circuit portion areas 256 and/or the two computing components 257 would stop at 0.74 V. If, in this scenario, the local voltage drops to 0.745 V, the sensor circuits 260 associated with both of the two circuit portion areas 256 and/or both of the two computing components 257 may generate signaling indicative of an "undervoltage" condition (e.g., a condition in which there appears to be too little voltage supplied to maintain operation of the circuit portion areas 256 and/or the computing components 257).

In embodiments in which the two circuit portion areas 256 and/or two computing components 257 exhibit similar temperature characteristics (e.g., scenarios in which two circuit portion areas 256 and/or two computing components 257 exhibit a generally uniform relationship between applied voltage, temperature, and power consumption), embodiments of the present disclosure allow for a magnitude of an applied voltage signal to be reduced as the temperature increases to achieve a reduction in power consumption. For instance, scenarios may arise in which both of the two circuit portion areas 256 and/or both of the two computing components 257 require 0.75 V for operation but one of the two circuit portion areas 256 and/or the two computing components 257 exhibits a larger increase in temperature (and, hence a larger power consumption) at this voltage value.

As an example, if a first of the circuit portion areas 256 and/or one of the computing components 257 can operate at 0.75 V with a temperature of 85° C. and a second one of the circuit portion areas 256 and/or one of the computing components 257 can operate at 0.73 V with a temperature of 85° C., but one or more of the sensor circuits 260 detect that the first of the circuit portion areas 256 and/or one of the computing components 257 is experiencing a temperature of 100° C. while the second of the circuit portion areas 256 and/or one of the computing components 257 is still experiencing a temperature of 85° C., the voltage management circuitry 213 can determine that the first of the circuit portion areas 256 and/or one of the computing components 257 can safely operate at a lower voltage than 0.75 V (e.g., 0.74 V, etc.). Accordingly, the voltage management circuitry 213 can generate the voltage management control signal 253 such that the voltage applied by the voltage regulator 252 corresponds to the lower voltage (e.g., 0.74 V in this non-limiting example) in order to reduce power consumed by the system 201.

In such instances, the voltage regulation circuitry 201 can determine that a weight (e.g., an amount of gain) corresponding to one of the two circuit portion areas 256 and/or one of the two computing components 257 indicates that this particular one of the two circuit portion areas 256 and/or one of the two computing components 257 should be prioritized for subjection to the temperature-based voltage management techniques described herein. For example, if two or more of the circuit portion areas 256 and/or two or more of the computing components 257 exhibit similar temperature characteristics at a given voltage, but one of such circuit portion areas 256 and/or one of the computing components 257 consumes and/or dissipates a higher amount of power, the circuit portion area 256 and/or the computing component 257 that consumes and/or dissipates a higher amount of power can be prioritized for receipt of a modified voltage (e.g., from the voltage regulator 252 based on the voltage management control signal 253 generated by the voltage management circuitry 213.

Stated alternatively, if there is a gain of 2 associated with one of the two circuit portion areas 256 and/or one of the two computing components 257, the 0.75 V–0.745V=0.05V undervoltage may be magnified (e.g., gained) to 0.1 V using the gain factor of 2 (e.g., because the gain in this example is 2 and 0.05 V multiplied by 2 is 0.1 V) and may cause the voltage regulator 252 to provide additional voltage to the voltage signal line 221 (e.g., to overcompensate for the voltage discrepancy). It is noted that an embodiment in which the gain is 2 is merely illustrative and other values for the gain are contemplated by the disclosure. This feature, among other features of the present disclosure can allow for delays in measuring the voltage using the sensor circuits 260 and/or for adjusting the voltage output to provide the modified voltage (e.g., by the voltage regulator 252) to be accounted for, thereby improving the functioning of a computing system in which aspects of the present disclosure are deployed.

More broadly speaking, each of the sensor circuits 260 can have a particular (e.g., temperature, voltage, and/or current) threshold associated therewith and/or a particular gain threshold associated therewith. Further, each sensor circuit 260 can be configured based on characteristics of the circuit portion area 256 and/or the computing component 257 that the sensor circuit 260 is coupled to and/or monitoring.

In embodiments in which the modified voltage is generated in response to the circuit portion areas 256 and/or the computing components 257 experiencing elevated temperatures (as detected by the sensor circuits 260, for example), it can be beneficial to modify the voltage to reduce the amount of power consumed by the system (and therefore the temperature of the circuit portion areas 256 and/or the computing components 257). As described herein, this process can be dynamic, as oscillations around a temperature value and/or voltage value can occur due to the dynamic nature of circuit components such as the circuit portion areas 256 and/or the computing components 257. In addition, and in particular with respect to temperatures, it can be the case that particular circuit portion areas 256 and/or computing components 257 can act as "aggressor" components that, by virtue of exhibiting higher temperatures than neighboring components, can cause the neighboring components to increase in temperature as well. Accordingly, aspects of the present disclosure allow for remediation of such characteristics by dynamically monitoring the sensor circuits 260 and providing information to the voltage management component 213 such that the voltage management component 213 can generate the voltage management control signal 253 to control application of voltages generated by the voltage regulator 252.

As shown in FIG. 2, the voltage management system 201 can be coupled to one or more computing components 257. Although not explicitly shown in FIG. 2, the computing components 257 can include one or more sensor circuits, which can be analogous to the sensor circuits 260. The computing components 257 are generally external to the voltage regulation circuitry 255 (i.e., the computing components are physically distinct from a chip, such a SoC that, at minimum, the voltage regulation circuitry 255 is deployed on) but are communicatively couplable to the voltage regulation circuitry 255 such that signaling can be exchanged between the voltage regulation circuitry 255 and the computing components. Non-limiting examples of the computing components can include controllers, memory devices, graphics processing units, processors/co-processors, and/or logic blocks, among others that are deployed on a memory sub-system (e.g., the memory sub-system 110 illustrated in FIG. 1, herein) in which the temperature-based voltage management system 201 operates.

In some embodiments, characteristics (e.g., the quality characteristics 366 illustrated in FIG. 3, herein) of the circuit portion areas 256 and/or the computing components 257 coupled to the voltage regulation circuitry 255 can further exacerbate the IR drop an/or voltage drop discussed above. For example, higher than expected currents that can be present due to leaky silicon and/or dynamic peak currents, among other possibilities, can lead to scenarios in which the voltage regulator 252 is unable to consistently provide adequate voltage to the voltage signal line 221. As described above, some conventional approaches may attempt to rectify this by increasing the size, complexity, and/or power available to the voltage regulator 225.

However, as mentioned above, these approaches can be costly in terms of space, power consumption, and/or heat dissipation, among other factors. Further, because it may only be necessary to temporarily alter the voltage to the voltage signal line 221, increasing the size, complexity, and/or power available to the voltage regulator 252 may be unnecessary. Accordingly, aspects of the present disclosure provide voltage management circuitry 213 that is configured to determine a temperature, voltage and/or current, and/or a quality characteristic experienced by the circuit portion areas 256 and/or the computing components 257 and provide signaling (e.g., a voltage management control signal 253) indicative of these data to the voltage regulator 252. The voltage regulator 252 can, based on the voltage management control signal 253, modify a voltage signal applied to the voltage signal line 221 to provide voltage compensation to at least one of the computing components 257 and/or to at least one circuit portion area 256 coupled to the voltage regulator 252.

In addition to, or in the alternative, the voltage regulator 252 and/or the voltage management circuitry 213 can be provided in the voltage management system 201 such that power dissipation characteristics and/or electrical noise generation characteristics of the voltage regulator 252 and/or the voltage management circuitry 213 are at least marginally optimized for the temperature-based voltage management system 201. For example, if a comparatively more powerful voltage regulator 252 (e.g., in terms of physical size, power output, etc.) is deployed in the temperature-based voltage management system 201, characteristics of the voltage management circuitry 213 may be chosen such that the voltage management circuitry 213 is only activated (e.g., only supplies a voltage management control signal) to control peak power dissipation associated with the voltage regulator 252. As another example, characteristics of the voltage management circuitry 213 may be chosen such that the voltage management circuitry 213 operates at a relatively low noise level in scenarios in which noise concerns in the temperature-based voltage management system 201 may be important. In any event, by providing the voltage management circuitry 213 in a manner consistent with desired parameters (e.g., peak power dissipation, noise generation, physical size, thermal dissipation, reaction time to voltage or current overshoots or undershoots, etc.) of the temperature-based voltage management system 201 in which the voltage management circuitry 213 is deployed, embodiments of the present disclosure provide improvements over the conventional approaches mentioned above.

Further, embodiments of the present disclosure can address shortcomings that arise in scenarios in which a system, such as the system 201, are expected to perform within some specific performance vs. power and/or performance vs. temperature requirements (e.g., to provide an expected quality of service or other performance metric expected of a user of the system 201). In some previous approaches, circuit portion area(s) 256 and/or computing component(s) 257 may be operated at a "high" performance level until a certain threshold temperature (e.g., 70° C.) is reached. Such approaches may then throttle overall performance of the circuit portion area(s) 256 and/or computing component(s) 257 to a "medium" performance level while the temperature of such circuit portion area(s) 256 and/or computing component(s) 257 is between 70° C. and 100° C. Once one or more of the circuit portion area(s) 256 and/or computing component(s) 257 have reached a threshold temperature of 100° C., such approaches may further throttle the performance of the circuit portion area(s) 256 and/or computing component(s) 257 to a "low" performance level. In general, the "performance levels" described above relate to a rate (e.g., a speed) at which the circuit portion area(s) 256 and/or computing component(s) 257 process information and/or commands.

In contrast, embodiments described herein allow for a voltage generated by the voltage regulator 252 to be modified, thereby allowing for a wider acceptable temperature range while maintaining an expected performance of the system 201. For example, by reducing the value of the voltage signal (e.g., by supplying a modified voltage signal) generated by the voltage regulator 252 based on the voltage management control signal 253 described herein, it may be possible to continue to operate the circuit portion area(s) 256 and/or computing component(s) 257 at a "high" performance level until the temperature of the circuit portion area(s) 256 and/or computing component(s) 257 reaches a threshold temperature value of 75° C. (or higher). Continuing with this example, embodiments of the present disclosure can allow for a "medium" performance level to be achieved while the temperature of the circuit portion area(s) 256 and/or computing component(s) 257 is between 75° C. and 105° C. Accordingly, the "low" performance level may not be activated until the temperature of the circuit portion area(s) 256 and/or computing component(s) 257 exceeds 105° C.

It is noted that the enumerated temperature values given in the foregoing paragraphs are merely illustrative of a particular scenario and, accordingly, other temperature values and/or ranges will be understood to be contemplated within the scope of the disclosure. For example, embodiments of the present disclosure may operate at the "high" performance level until the temperature of the circuit portion area(s) 256 and/or computing component(s) 257 reaches a threshold temperature value of 74.09° C. (or some other arbitrary temperature value based on the quality characteristics of the circuit portion area(s) 256 and/or computing component(s) 257) and activate the "low" performance level when the temperature of the circuit portion area(s) 256 and/or computing component(s) 257 exceeds 106.01° C. (or some other arbitrary temperature value based on the quality characteristics of the circuit portion area(s) 256 and/or computing component(s) 257). Further, it will be appreciated that the temperature ranges for the various performance levels may differ based on the architecture of a system in which the components described herein operate, workloads experienced by such components, manufacturing characteristics of such components, etc.

In addition, due to trends in modern semiconductor technology whereby increased speed performance of silicon chips and/or dice (and, hence the circuits that are formed by one or more of such silicon chips and/or dice) is demanded, embodiments of the present disclosure allow for the voltage regulator 252 to generate a modified voltage signal based on temperatures and/or quality characteristics detected by the sensor circuitry 260 (as processed by the voltage management circuitry 213) that may arise due to such increased speeds (e.g., clocking speeds, increased throughput, etc.) experienced by the silicon chips and/or dice of the system 201. For example, embodiments of the present disclosure can detect an increase in a temperature of the circuit portion area(s) 256 and/or computing component(s) 257) that results from the circuit portion area(s) 256 and/or computing component(s) 257) performing operations at a particular speed (e.g., clocking time, quantity of FLOPS performed within a given time period, etc.) and determine that a modified voltage signal should be applied by the voltage regulator 252 in order to reduce power consumption of the system 201 while still allowing for operations to be performed at these increased speeds. That is, because increasing the speed and/or performance of the circuit portion area(s) 256 and/or computing component(s) 257 will generally give rise to a corresponding increase in temperature, embodiments described herein can allow for the modified voltage signal to be generated and applied to the circuit portion area(s) 256 and/or computing component(s) 257 to maintain a same or similar speed while reducing power consumption of the system 201 while reducing the applied voltage via the modified voltage signal.

In a non-limiting example, an apparatus (e.g., the computing system 100 illustrated in FIG. 1, the voltage management circuitry 113/213/313 illustrated in FIG. 1, FIG. 2, and FIG. 3, the voltage regulation systems 201/301 illustrated in FIG. 2 and FIG. 3, and/or components thereof), includes a voltage regulator 252 and voltage management circuitry 213. The voltage management circuitry 213 can receive signaling indicative of a temperature of a circuit portion area 256 coupled to the voltage management circuitry 213 and receive signaling indicative of a voltage or a current of the circuit portion area 256. The voltage management circuitry 213 can generate, based on the signaling indicative of temperature of the circuit portion area and the signaling indicative of the voltage or the current of the circuit portion area 256, a voltage management control signal 253 and transfer the voltage management control signal 253 to the voltage regulator 252. The voltage regulator 252 can generate a voltage signal in response to receipt of the voltage management control signal 253. The voltage regulator 252 can generate the voltage signal to control an amount of power consumed by the circuit portion area 256.

In some embodiments, the voltage management circuitry 213 can receive signaling indicative of quality characteristics (e.g., the quality characteristics 366/367 of FIG. 3) of the circuit portion area 256 and generate the voltage management control signal 253 based on the signaling indicative of temperature of the circuit portion area 256, the signaling indicative of the voltage or the current of the circuit portion area 256, and the signaling indicative of the quality characteristics of the circuit portion area 256. As described herein, the quality characteristics of the circuit portion area 256 can be determined using quality characteristics of at least a portion of one die associated with the circuit portion area 256.

Figure 3:
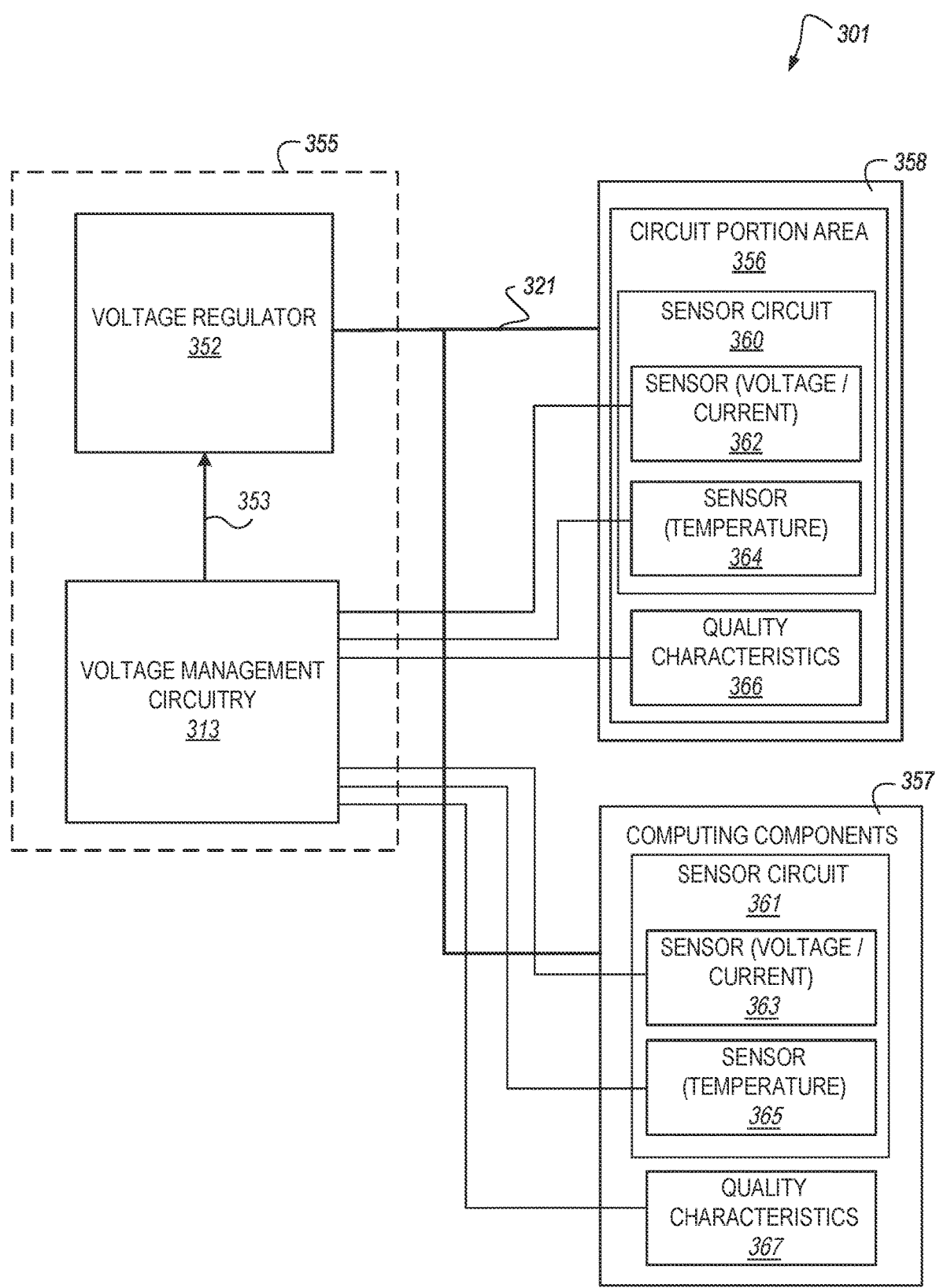
FIG. 3 illustrates another example of a temperature-based voltage management system in accordance with some embodiments of the present disclosure.

Continuing with this non-limiting example, the voltage management circuitry 213 can receive the signaling indicative of the temperature of the circuit portion area 256 from a temperature sensor circuit (e.g., the temperature sensor 364/365 of FIG. 3) and/or receive the signaling indicative of the voltage or the current of the circuit portion area 256 from a voltage sensor circuit (e.g., the voltage/current sensor 362/362 of FIG. 3). Embodiments are not limited to receipt of such signals from multiple sensor circuits, however, and in some embodiments, the voltage management circuitry 213 is configured to receive the signaling indicative of the temperature of the circuit portion area and to receive the signaling indicative of the voltage or the current of the circuit portion area from single sensor circuit 260.

In another non-limiting example, an apparatus (e.g., the computing system 100 illustrated in FIG. 1, the voltage management circuitry 113/213/313 illustrated in FIG. 1, FIG. 2, and FIG. 3, the voltage regulation systems 201/301 illustrated in FIG. 2 and FIG. 3, and/or components thereof), includes a voltage regulator 252, a first circuit portion area 256 (e.g., one of the partitions A-F) and first sensor circuitry 260 (e.g., the sensor circuitry 260-1) coupled to the first circuit portion area (e.g., the partition A). The apparatus further includes a second circuit portion area 256 (e.g., one of the partitions A-F), second sensor circuitry 260 (e.g., the sensor circuitry 260-2) coupled to the second circuit portion area (e.g., the partition B), and voltage management circuitry 213 coupled to the first sensor circuitry 260-1, the second sensor circuitry 260-2, and the voltage regulator 252. In some embodiments, the voltage management circuitry 213, the first sensor circuitry 260-1, the second sensor circuitry 260-2, the first circuit portion area 256 (e.g., the partition A), the second portion area 256 (e.g., the partition B), and the voltage regulator 252 comprise a system-on-chip.

Continuing with this non-limiting example, the voltage management circuitry 213 can receive signaling indicative of a voltage, a current, or a temperature, or any combination thereof, associated with the first circuit portion area 256 (e.g., the partition A) from the first sensor circuitry 260-1 and receive signaling indicative of a voltage, a current, or a temperature, or any combination thereof, associated with the second circuit portion area 256 (e.g., the partition B) from the second sensor circuitry 260-2. The voltage management circuitry 213 can generate, based on the received signaling from the first sensor circuitry (e.g., the partition A) and the second sensor circuitry (e.g., the partition B), a voltage management control signal 253 and transfer the voltage management control signal 253 to the voltage regulator 252.

Upon receipt of the voltage management control signal 253, the voltage regulator 252 can generate a voltage signal 221 in response to receipt of the voltage management control signal 253 and apply the voltage signal 221 to the first circuit portion area (e.g., the partition A) and/or the second circuit portion area (e.g., the partition B). As described above, the voltage signal 221 generated by the voltage regulator 252 in response to receipt of the voltage management control signal 253 can be a modified voltage signal (e.g., can have a lower voltage than a voltage signal generated by the voltage regulator 252 prior to receipt of the voltage management control signal 253). In some embodiments, the voltage regulator 252 is further configured to apply the voltage signal 221 to the first circuit portion area (e.g., the partition A) and/or the second circuit portion area (e.g., the partition B) to control an amount of power consumed by the first circuit portion area (e.g., the partition A) or the second circuit portion area (e.g., the partition B).

As described in more detail in connection with FIG. 3, herein, the voltage management circuitry 213 can be further configured to generate the voltage management control signal 253 based on quality characteristics (e.g., the quality characteristics 366 illustrated in FIG. 3) of the first circuit portion area (e.g., the partition A) and/or the second circuit portion area (e.g., the partition B). In some embodiments, the quality characteristics comprise information corresponding to process variation characteristics associated with at least a portion of one die included in the first circuit portion area (e.g., the partition A) and/or at least a portion of one die included in the second circuit portion area (e.g., the partition B) that occur during manufacture of the at least one die that is included in the first circuit portion area and/or the second circuit portion area.

Continuing with this non-limiting example, the first sensor circuitry 260-1 includes a first sensor circuit to determine the voltage or the current associated with the first circuit portion area (e.g., the partition A) and a second sensor circuit to determine the temperature associated with the first circuit portion area (e.g., the partition A). Similarly, the second sensor circuitry 260-2 can comprise a first sensor circuit to determine the voltage or the current associated with the second circuit portion area (e.g., the partition B) and a second sensor circuit to determine the temperature associated with the second circuit portion area (e.g., the partition B). The sensor circuits that determine the voltages or the currents can be analogous to the voltage/current sensor 362 illustrated in FIG. 3, while the sensor circuits that determine the temperatures can be analogous to the temperature sensor 364 illustrated in FIG. 3.

In some embodiments, the voltage regulator 252 is further configured to alter a voltage signal generated by the voltage regulator 252 prior to receipt of the voltage management control signal 253. For example, the voltage regulator 252 can alter a generated voltage signal such that the altered voltage signal has a lower voltage associated therewith than the voltage signal generated by the voltage regulator prior to receipt of the voltage management control signal 253. In some embodiments, the altered voltage signal is generated when the voltage management control signal 253 is indicative of the voltage, the current, or the temperature, or any combination thereof meeting a threshold criterion. As discussed herein, wherein the voltage regulator 252 can be further configured to apply the altered voltage signal to the first circuit portion area (e.g., the partition A) and/or the second circuit portion area (e.g., the partition B).

Continuing with this non-limiting example, the apparatus can further include third sensor circuitry (e.g., the sensor circuit 360 of the computing component 357 illustrated in FIG. 3, herein) coupled to a computing component 257. The voltage management circuitry 213 can be coupled to the computing component 257 and the third sensor circuitry. In such embodiments, the voltage management circuitry 213 can be configured to receive signaling indicative of a voltage, a current, a temperature, and/or quality characteristics, or any combination thereof, associated with the computing component 257 from the third sensor circuitry and generate the voltage management control signal 253 based on the received signaling from the third sensor circuitry. In some embodiments, the third sensor circuitry includes a first sensor circuit (e.g., the voltage/current sensor 362 of the computing component 357 illustrated in FIG. 3, herein) to determine the voltage or the current associated with the computing component and a second sensor circuit (e.g., the temperature sensor 364 of the computing component 357 illustrated in FIG. 3, herein) to determine the temperature associated with the computing component. Further, as described herein, the voltage management circuitry 213 can be further configured to generate the voltage management control signal 253 based on quality characteristics (e.g., the quality characteristics 366 of the computing component 357 illustrated in FIG. 3, herein) of the computing component 257.

FIG. 3 illustrates another example of a temperature-based voltage management system 301 in accordance with some embodiments of the present disclosure. The example system 301, which can be referred to in the alternative as an "apparatus," includes voltage regulation circuitry 355, which includes a voltage regulator 352 and voltage management circuitry 313. The voltage regulation circuitry 355 is coupled to a circuit area 358, which includes one or more circuit area portions 356, and one or more computing components 357. The voltage regulation circuitry 355, voltage regulator 352, and voltage management circuitry 313 can be analogous to the voltage regulation circuitry 255, voltage regulator 252, and voltage management circuitry 213 of FIG. 2, respectively. Further, the circuit area 358 can be analogous to the circuit area 258 of FIG. 2, while the one or more circuit area portions 356 and the one or more computing components 357 can be analogous to the one or more circuit area portions 256 and the one or more computing components 257 of FIG. 2.

As shown in FIG. 3, the circuit portion area 356 includes a sensor circuit 360, which can be analogous to the sensor circuit(s) 260 illustrated in FIG. 2. The sensor circuits 360 can include various hardware circuitry and/or circuitry components to detect voltage levels, current levels, and/or temperatures applied to the circuit portion areas 356 via the voltage signal line 321 and/or the voltage supply lines that are fed from the voltage signal line 321. As shown in FIG. 3, the sensor circuit 360 further includes a voltage/current sensor 362 and a temperature sensor 364. The sensor circuit 360 further includes (e.g., stores or is otherwise able to determine) information corresponding to quality characteristics 366 of the circuit portion area 356. In addition, the computing components 357 include a sensor circuit 361, which further includes a voltage/current sensor 363 and a temperature sensor 365. The sensor circuit 361 further includes (e.g., stores or is otherwise able to determine) information corresponding to quality characteristics 367 of the computing component 357.

As described above, the quality characteristics 366/367 can refer to physical characteristics of silicon chips, dice, and/or components that are determined based on a relative location on a wafer at which the silicon chips and dice were fabricated. Post-manufacture analysis of such silicon chips, dice, and/or components can be performed to determine the quality characteristics 366/367 and information corresponding thereto can be stored as part of the quality characteristics 366/367 (e.g., in a memory, cache, or other suitable data storage medium). Embodiments are not so limited, however, and the quality characteristics 366/367 can be determined during run-time of the system 301.

As shown in FIG. 3, the system 301 includes a voltage signal line 321 (which can be analogous to the voltage signal line 221 illustrated in FIG. 2) coupling the voltage regulator 352 to the circuit area 355 and the computing components 357. The voltage signal line 321 be split into one or more voltage supply lines that can provide power to the circuit portion areas 356, the sensor circuits 360/361, and/or the computing components 357.

The sensor circuits 360 can be configured to apply signaling indicative of a change in the current or the voltage, and/or the temperature associated with the circuit portions areas 356 while the sensor circuits 361 can be configured to apply signaling indicative of a change in the current or the voltage, and/or the temperature associated with the computing components 357 to the voltage management circuitry 313 in a similar manner as described above in connection FIG. 2. In response to receipt of such signaling, the voltage management circuitry 313 can determine characteristics of the received signaling and generate the voltage management control signal 353, as described above, to cause the voltage regulator 352 to apply a modified voltage to the voltage signal line 321.

Due to changes in the voltages (or currents) and/or temperatures detected by the sensor circuits 360/361, the output of the voltage management circuitry 313 may oscillate due to the voltage (or current) detected by the sensor circuits 360/361 being slightly above or below the threshold(s). In some embodiments, signal suppression circuitry, such as an integrator can be used to filter these oscillations, thereby allowing for the output of the voltage regulator 352 to expose a slow and low magnitude ripple around the threshold voltage on the output line 321.

In a non-limiting example, a system (e.g., the computing system 100 illustrated in FIG. 1 and/or the temperature-based voltage management system 201/301 illustrated in FIG. 2 and FIG. 3, and/or components thereof), includes a voltage regulator 352, a circuit portion area 356 and first sensor circuitry 360 coupled to the first circuit portion area 356. The system can further include a computing component 357 and second sensor circuitry 361 coupled to the computing component 357. Voltage management circuitry 313 can be coupled to the first sensor circuitry 360, the second sensor circuitry 361, and the voltage regulator 352. In some embodiments, the sensor circuitry 360 is resident on the first circuit portion area 356 and the sensor circuitry 361 is resident on the computing components 357, although embodiments are not so limited.

The voltage management circuitry 313 can receive signaling indicative of a voltage (e.g., from the voltage/current sensor 362), a current (e.g., from the voltage/current sensor 362), a temperature (e.g., from the temperature sensor 364), and/or or a quality characteristic 366 associated with the circuit portion area 356 from the first sensor circuitry 360 and can receive signaling indicative of a voltage (e.g., from the voltage/current sensor 363), a current (e.g., from the voltage/current sensor 363), a temperature (e.g., from the temperature sensor 365), and/or or a quality characteristic 367 associated with the computing component 357 from the second sensor circuitry 361. Although illustrated as two discrete sensor circuitries (e.g., the first sensor circuitry 360 and the second sensor circuitry 361), embodiments are not so limited, and any number of sensor circuitries may be provided to the temperature-based voltage management system 301. In addition, the voltage/current sensor 362 and/or 363, the temperature sensor 364 and/or 365, and/or the quality characteristics 366/367 may be collocated on one or more circuit components or may be discrete components that are coupled to the voltage management circuitry 313, the circuit portion area(s) 356, and/or the computing component (s) 357 but are not necessarily resident thereon. In some embodiments, the quality characteristics 366/367 can include information corresponding to process variation characteristics associated with at least one die (or at least a portion of one die) included in the circuit portion area 356 and/or the computing component 357 that occur during manufacture of the at least one die (or at least the portion of the one die).

Continuing with this non-limiting example, the voltage management circuitry 313 can generate, based on the received signaling from the first sensor circuitry 360 and the second sensor circuitry 361, a voltage management control signal 353 and transfer the voltage management control signal 353 to the voltage regulator 352. In some embodiments, the voltage regulator 352 can alter a first voltage signal generated by the voltage regulator 352 prior to receipt of the voltage management control signal 353 to generate a second voltage signal in response to receipt of the voltage management control signal 353 and apply the second voltage signal to the circuit portion area 356 and/or the computing component 357, as described herein. As described herein, the voltage regulator 352 can be further configured to apply the second voltage signal to the circuit portion area 356 or the computing component 357, or both, to control an amount of power consumed by the first circuit portion area 356 or the computing component 357, or both.

In some embodiments, the second voltage signal is generated when the voltage management control signal 353 is indicative of the voltage, the current, the temperature, or the quality characteristic, or any combination thereof of the circuit portion area 356 and/or the computing component 357 meets a criterion. The criterion can correspond to a threshold voltage, current, and/or temperature experienced by the circuit portion areas 356 and/or the computing components 357. Further, the criterion can correspond to the quality characteristic(s) of the circuit portion area 356 and/or the computing component 357. For example, the criterion can be based on a location on a wafer at which the circuit portion areas 356 and/or the computing components 357 were formed during manufacturing and can therefore correspond to a threshold leakage power distribution, localized IR drop, temperature inversion, etc. associated with the circuit portion areas 356 and/or the computing components 357. Embodiments are not so limited, however, and in some embodiments, the criterion can be based on a quality of the wafer itself (e.g., because different wafers can have inherently different levels of quality) on which the circuit portion areas 356 and/or the computing components 357 were formed as compared to circuit portion areas and/or the computing components that were formed other wafers.

In some embodiments, the quality characteristics associated with the circuit portion areas 356 and/or the computing components 357 (and hence, the threshold criterion) can be based on the power consumption as a function of temperature of the circuit portion areas 356 and/or the computing components 357. For example, the quality characteristics can be used to classify the circuit portion areas 356 and/or the computing components 357 as "slow," typical," and "fast." The "fast" circuit portion areas 356 and/or the computing components 357 are generally those circuit portion areas 356 and/or the computing components 357 that, due to their quality characteristics, exhibit higher power consumption at higher temperatures as compared to "typical" or "slow" circuit portion areas 356 and/or the computing components 357 which, due to their quality characteristics, exhibit lower power consumption at higher temperatures as compared to the "fast" and "typical" circuit portion areas 356 and/or the computing components 357. Whether a circuit portion area 356 and/or a computing component 357 is classified as "slow," "typical," or "fast" can be based on a location on a wafer at which the silicon chips and/or dice that are used to form the circuit portion areas 356 and/or the computing components 357 were fabricated. Further, as discussed above, the quality of different wafers that may be used in manufacturing the silicon chips and/or dice that are used to form the circuit portion areas 356 and/or the computing components 357 can contribute to whether a circuit portion area 356 and/or a computing component 357 is classified as "slow," "typical," or "fast."

As mentioned above, as a result of single digit nanometer technology, in addition to the quality characteristics described above, the circuit portion areas 356 and/or the computing components 357 can further include physical locations or areas that can exhibit slower performance at different (e.g., lower or higher) temperatures. Therefore, it can be useful to operate such circuit portion areas 356 and/or the computing components 357 at a determined optimal temperature range to maximize performance while minimizing power consumption to the extent possible. Accordingly, in some embodiments, the voltage management circuitry 313 can receive signaling from the sensor circuits 360 that include information corresponding to the temperatures of such physical locations or areas that can exhibit slower performance at different (e.g., lower or higher) temperatures and can generate the voltage management control signal 353 based at least in part on such signaling.

In some embodiments, a circuit portion area 356 and/or a computing component 357 can be formed on a same silicon chip or die. In general, the quality characteristics of the silicon chip or die can exhibit less process variation than a process variation between different silicon chips and/or dice manufactured on a same wafer or variation between different wafers. However, it is also possible to fuse multiple dice together to form the circuit portion area(s) 356 and/or the computing component(s) 357 In such embodiments, the quality characteristics exhibited by the circuit portion area(s) 356 and/or the computing component(s) 357 can be an average of the quality characteristics of the silicon chips and/or dice that are fused to form the circuit portion area(s) 356 and/or the computing component(s) 357. In either embodiment, the sensor circuitry 360 and/or the sensor circuitry 361 can be coupled to the circuit portion area 356 and/or a computing component 357 to measure the quality characteristics 366/367 of the circuit portion area(s) 356 and/or the computing component(s) 357. In some embodiments, the quality characteristics 366/367 can include process variation characteristics associated with in the circuit portion area 356 or the computing component 357 that occur during manufacture of the circuit portion area 356 of the computing component 357, information obtained from circuitry used during manufacture of the circuit portion area 356 of the computing component 357, information detected by the first sensor circuit 360 or the second sensor circuit 361, and/or testing information obtained from analysis of the circuit portion area 356 or the computing component 357.

In some embodiments, the first sensor circuitry 360 can include a first sensor circuit (e.g., the voltage/current sensor 362) to determine the voltage or the current associated with the circuit portion area 356 and a second sensor circuit (e.g., the temperature sensor 364) to determine the temperature associated with the circuit portion area 356. Similarly, the second sensor circuitry 361 can include a first sensor circuit (e.g., the voltage/current sensor 363) to determine the voltage or the current associated with the computing component 357 and a second sensor circuit (e.g., the temperature sensor 365) to determine the temperature associated with the computing component 357.

Figure 4:
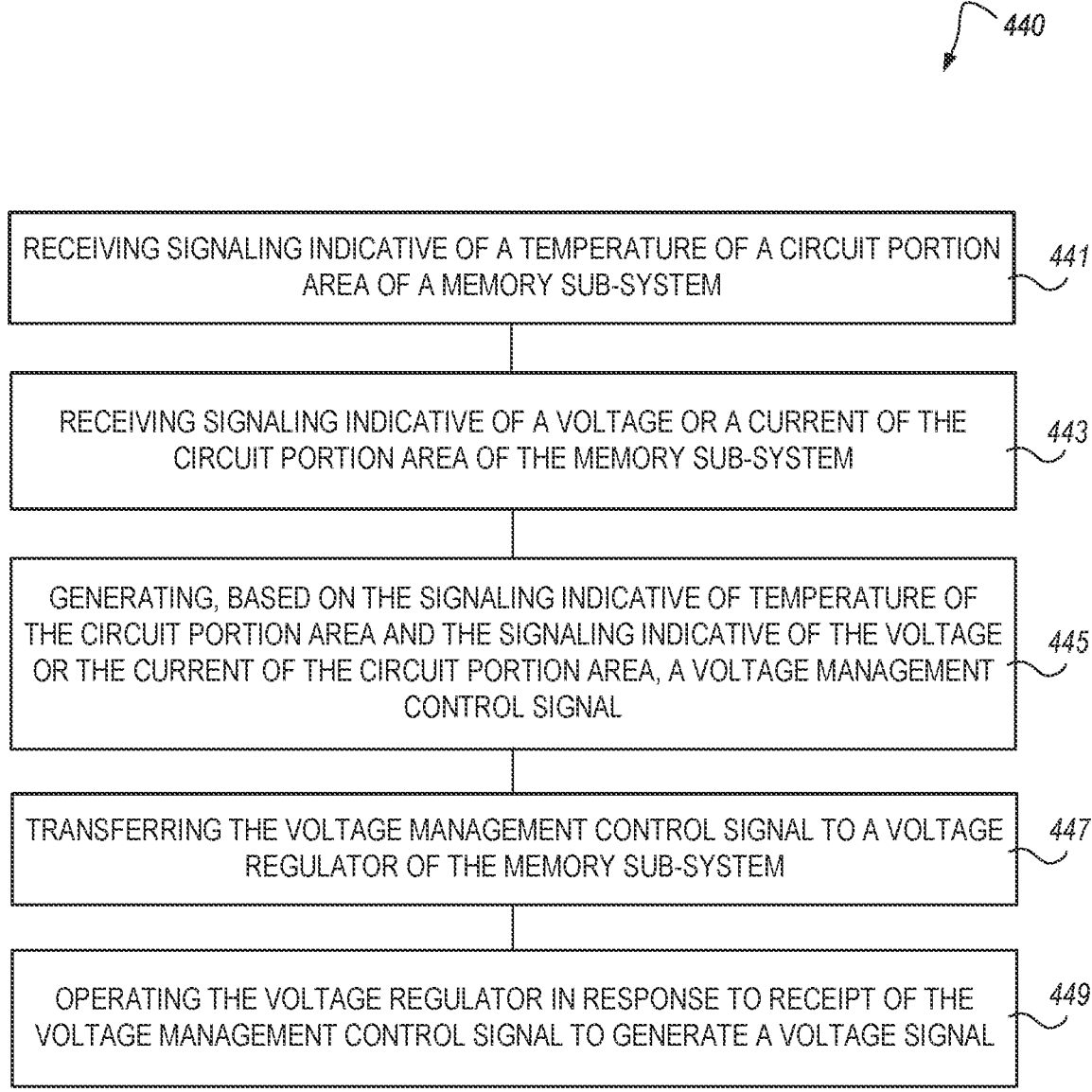
FIG. 4 is a flow diagram corresponding to a method for temperature-based voltage management in accordance with some embodiments of the present disclosure.

FIG. 4 is a flow diagram corresponding to a method 440 for temperature-based voltage management in accordance with some embodiments of the present disclosure. The method 440 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 440 is performed by the voltage management circuitry 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 441, the method 440 includes receiving signaling indicative of a temperature of a circuit portion area of a memory sub-system. The circuit portion areas can be analogous to the circuit portion areas 256 and/or 356 illustrated in connection with FIG. 2 and FIG. 3, herein, while the memory sub-system can be analogous to the memory sub-system 110 illustrated in FIG. 1, herein.

At operation 443, the method 440 includes receiving signaling indicative of a voltage or a current of the circuit portion area of the memory sub-system. In some embodiments, the method 440 includes receiving the signaling indicative of the temperature of the circuit portion area from a temperature sensor circuit (e.g., the temperature sensor(s) 364/365 illustrated in FIG. 3) and receiving the signaling indicative of the voltage or the current of the circuit portion area from a voltage sensor circuit (e.g., the voltage/current sensor(s) 362/363 illustrated in FIG. 3). Embodiments are not so limited, however, and in some embodiments, the method 440 can include receiving the signaling indicative of the temperature of the circuit portion area and receiving the signaling indicative of the voltage or the current of the circuit portion area from single sensor circuit (e.g., the sensor circuit(s) 260/360/361 illustrated in FIG. 2 and FIG. 3, herein).

At operation 445, the method 440 includes generating, based on the signaling indicative of temperature of the circuit portion area and the signaling indicative of the voltage or the current of the circuit portion area, a voltage management control signal (e.g., the voltage control signal 253/353 illustrated in FIG. 2 and FIG. 3, herein).

In some embodiments, the method 440 further includes receiving signaling indicative of quality characteristics (e.g., the quality characteristics 366/367 illustrated in FIG. 3, herein) of the circuit portion area. In such embodiments, the method 440 can further include generating the voltage management control signal based the signaling indicative of temperature of the circuit portion area, the signaling indicative of the voltage or the current of the circuit portion area, and the signaling indicative of the quality characteristics of the circuit portion area. As discussed in more detail, herein, the quality characteristics of the circuit portion area are determined using quality characteristics of at least one die included in the circuit portion area. For example, in some embodiments, the quality characteristics of the circuit portion area correspond to quality characteristics of at least one die included in the circuit portion area that are based on process variations associated with the at least one die (or a portion thereof) during manufacture of the at least one die (or the portion thereof).

At operation 447, the method 440 includes transferring the voltage management control signal to a voltage regulator (e.g., the voltage regulator 252/352 illustrated in FIG. 2 and FIG. 3, herein) of the memory sub-system. The voltage management control signal can be a digital signal or an analog signal that contains at least an indication of an amount of voltage (or current) to be modified by the voltage regulator to provide temperature-based voltage management in accordance with the disclosure.

At operation 449, the method 440 includes operating the voltage regulator in response to receipt of the voltage management control signal to generate a voltage signal. In some embodiments, the method 440 further includes operating the voltage regulator to generate the voltage signal to control an amount of power consumed by the circuit portion area. The voltage signal generated by the voltage can be a modified voltage signal, as described above, and can applied to the circuit portion area and/or the computing components (e.g., the computing components 257/357 illustrated in FIG. 2 and FIG. 3, herein) to reduce an amount of power consumed by the circuit portion areas and/or the computing components and, accordingly, by the memory sub-system as a whole.

Figure 5:
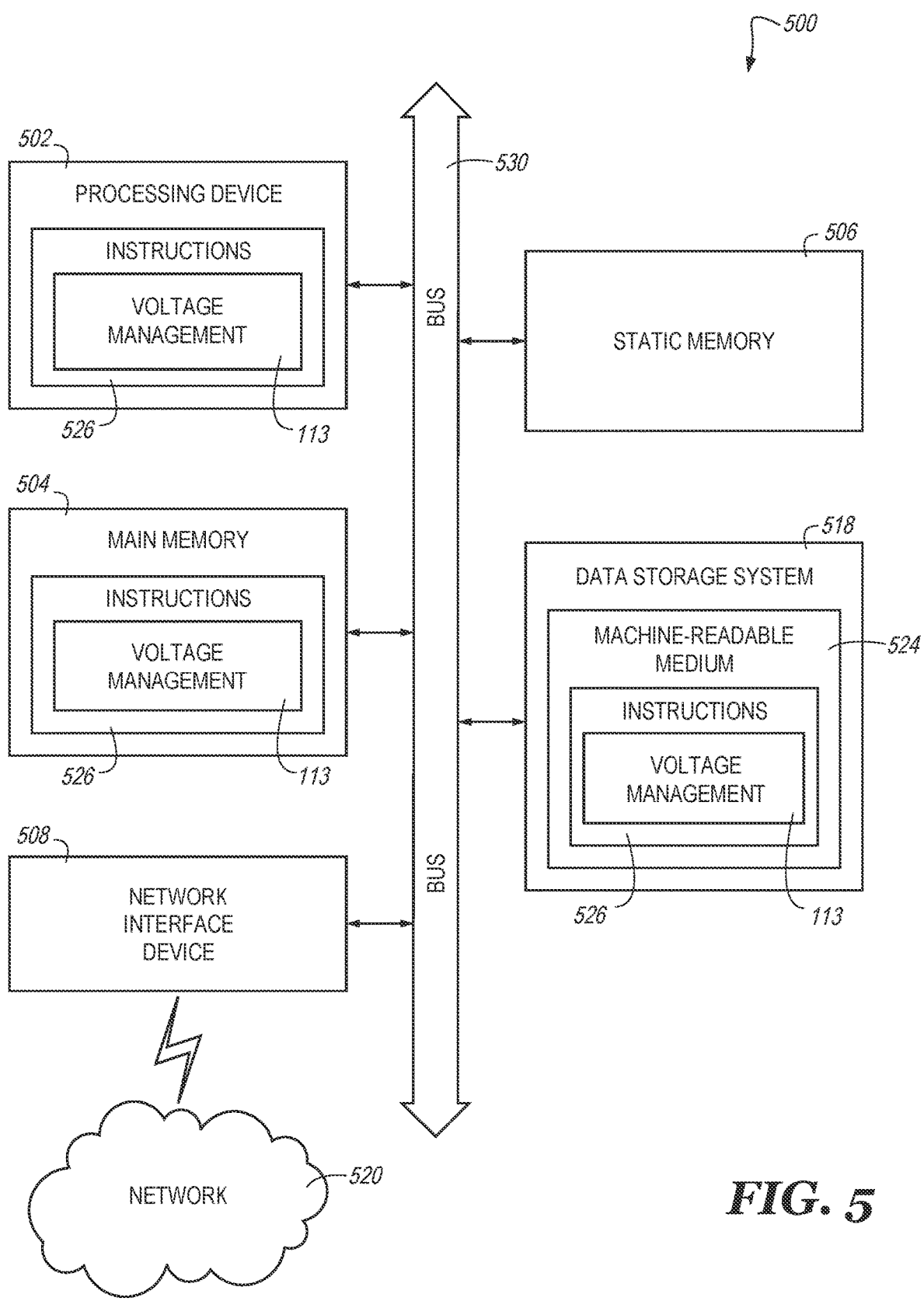
FIG. 5 is a block diagram of an example computer system in which embodiments of the present disclosure may operate.

FIG. 5 is a block diagram of an example computer system in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the voltage management circuitry 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to voltage management circuitry (e.g., the voltage management circuitry 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
receiving signaling indicative of a temperature of a circuit portion area of a memory sub-system from a temperature sensor located at the circuit portion;
receiving signaling indicative of a voltage or a current of the circuit portion area of the memory sub-system from a voltage or current sensor located at the circuit portion;
receiving signaling indicative of quality characteristics of the circuit portion area, including a classification of the circuit portion area as one of three types;
generating, based on the signaling indicative of temperature of the circuit portion area, the signaling indicative of the voltage or the current of the circuit portion area, and the signaling indicative of the quality characteristics, a voltage management control signal;
transferring the voltage management control signal to a voltage regulator of the memory sub-system; and operating the voltage regulator in response to receipt of the voltage management control signal to generate a voltage signal to control an amount of power consumed by the circuit portion area.

2. The method of claim 1, further comprising:
receiving the signaling indicative of the temperature of the circuit portion area from a temperature sensor circuit; and
receiving the signaling indicative of the voltage or the current of the circuit portion area from a voltage sensor circuit.

3. The method of claim 1, further comprising receiving the signaling indicative of the temperature of the circuit portion area and receiving the signaling indicative of the voltage or the current of the circuit portion area from single sensor circuit.

4. The method of claim 1, wherein the quality characteristics of the circuit portion area are determined using quality characteristics of at least one die included in the circuit portion area.

5. The method of claim 1, wherein the quality characteristics of the circuit portion area correspond to quality characteristics of at least a portion of one die included in the circuit portion area that are based on process variations associated with at least the portion of the one die during manufacture of the at least one die.

6. An apparatus, comprising:
a voltage regulator; and
voltage management circuitry, wherein the voltage management circuitry is configured to:
receive signaling indicative of a temperature of a circuit portion area coupled to the voltage management circuitry from a temperature sensor located at the circuit portion;
receive signaling indicative of a voltage or a current of the circuit portion area from a voltage or current sensor located at the circuit portion;
receive signaling indicative of quality characteristics of the circuit portion area, including a classification of the circuit portion area as one of three types;
generate, based on the signaling indicative of temperature of the circuit portion areas the signaling indicative of the voltage or the current of the circuit portion area, and the signaling indicative of the quality characteristics, a voltage management control signal; and
transfer the voltage management control signal to the voltage regulator, wherein the voltage regulator is configured to generate a voltage signal in response to receipt of the voltage management control signal to control an amount of power consumed by the circuit portion area.

7. The apparatus of claim 6, wherein the quality characteristics of the circuit portion area are determined using quality characteristics of at least a portion of one die associated with the circuit portion area.

8. The apparatus of claim 6, wherein the voltage management circuitry is configured to:
receive the signaling indicative of the temperature of the circuit portion area from a temperature sensor circuit; and
receive the signaling indicative of the voltage or the current of the circuit portion area from a voltage sensor circuit.

9. The apparatus of claim 6, wherein the voltage management circuitry is configured to receive the signaling indicative of the temperature of the circuit portion area and to receive the signaling indicative of the voltage or the current of the circuit portion area from single sensor circuit.

10. An apparatus, comprising:
a voltage regulator;
a first circuit portion area;
a first sensor located at the first circuit portion area;
a second circuit portion area;
a second sensor located at the second circuit portion area; and
voltage management circuitry coupled to the first sensor, the second sensor, and the voltage regulator, wherein the voltage management circuitry is configured to:
receive signaling indicative of a voltage, a current, or a temperature, or any combination thereof, associated with the first circuit portion area from the first sensor;
receive signaling indicative of quality characteristics of the first circuit portion area, including a classification of the first circuit portion area as one of three types;
receive signaling indicative of a voltage, a current, or a temperature, or any combination thereof, associated with the second circuit portion area from the second sensor;
receive signaling indicative of quality characteristics of the second circuit portion area, including a classification of the second circuit portion area as one of the three types;
generate, based on the received signaling from the first sensor the received signaling from the second sensor, and the signaling indicative of the quality characteristics, a voltage management control signal; and
transfer the voltage management control signal to the voltage regulator, wherein the voltage regulator is configured to:
generate a voltage signal in response to receipt of the voltage management control signal; and
apply the voltage signal to the first circuit portion area or the second circuit portion area, or both to control an amount of power consumed by the first circuit portion area, the second circuit portion area, or both.

11. The apparatus of claim 10, wherein the quality characteristics comprise information corresponding to process variation characteristics associated with at least one die included in the first circuit portion area or the second circuit portion area that occur during manufacture of the at least one die.

12. The apparatus of claim 10, wherein:
the first sensor comprises:
a first sensor circuit to determine the voltage or the current associated with the first circuit portion area, and
a second sensor circuit to determine the temperature associated with the first circuit portion area; and
the second sensor comprises:
a first sensor circuit to determine the voltage or the current associated with the second circuit portion area, and
a second sensor circuit to determine the temperature associated with the second circuit portion area.

13. The apparatus of claim 10, wherein the voltage regulator is further configured to alter a voltage signal generated by the voltage regulator prior to receipt of the voltage management control signal, wherein:
the altered voltage signal has a lower voltage associated therewith than the voltage signal generated by the voltage regulator prior to receipt of the voltage management control signal, and
the altered voltage signal is generated when the voltage management control signal is indicative of the voltage, the current, or the temperature, or any combination thereof meeting a threshold criterion, and wherein the voltage regulator is further configured to apply the altered voltage signal to the first circuit portion area or the second circuit portion area, or both.

14. The apparatus of claim 10, further comprising a third sensor coupled to a computing component, wherein the voltage management circuitry is coupled to the computing component and the third sensor, and wherein the voltage management circuitry is further configured to:
receive signaling indicative of a voltage, a current, or a temperature, or any combination thereof, associated with the computing component from the third sensor; and
generate the voltage management control signal based on the received signaling from the third sensor.

15. The apparatus of claim 14, wherein the third sensor comprises:
a first sensor circuit to determine the voltage or the current associated with the computing component, and
a second sensor circuit to determine the temperature associated with the computing component.

16. The apparatus of claim 14, wherein the voltage management circuitry is further configured to generate the voltage management control signal based on quality characteristics of the computing component.

17. The apparatus of claim 14, wherein the voltage management circuitry, the first sensor, the second sensor, the first circuit portion area, the second portion area, and the voltage regulator comprise a system-on-chip.

18. A system, comprising:
a voltage regulator;
a circuit portion area;
a first sensor located at the first circuit portion area;
a computing component;
a second sensor located at the computing component; and
voltage management circuitry coupled to the first sensor, the second sensor, and the voltage regulator, wherein the voltage management circuitry is configured to:
receive signaling indicative of a voltage, a current, a temperature, or a quality characteristic, or any combination thereof, associated with the circuit portion area from the first sensor, wherein the quality characteristic includes a classification of the circuit portion area as one of three types;
receive signaling indicative of a voltage, a current, a temperature, or a quality characteristic, or any combination thereof, associated with the computing component from the second sensor;
generate, based on the received signaling from the first sensor and the second sensor, a voltage management control signal; and
transfer the voltage management control signal to the voltage regulator, wherein the voltage regulator is configured to:
alter a first voltage signal generated by the voltage regulator prior to receipt of the voltage management control signal to generate a second voltage signal in response to receipt of the voltage management control signal; and
apply the second voltage signal to the circuit portion area or the computing component, or both to control an amount of power consumed by the circuit portion area, the computing component, or both.

19. The system of claim 18, wherein the second voltage signal is generated when the voltage management control signal is indicative of the voltage, the current, the temperature, or the quality characteristic, or any combination thereof of the circuit portion area or the computing component meets a criterion.

20. The system of claim 18, wherein:
the first sensor comprises:
a first sensor circuit to determine the voltage or the current associated with the circuit portion area, and
a second sensor circuit to determine the temperature associated with the circuit portion area; and
the second sensor comprises:
a first sensor circuit to determine the voltage or the current associated with the computing component, and
a second sensor circuit to determine the temperature associated with the computing component.

21. The system of claim 18, wherein the quality characteristic comprises information corresponding to:
process variation characteristics associated with in the circuit portion area or the computing component that occur during manufacture of the circuit portion area of the computing component,
information obtained from circuitry used during manufacture of the circuit portion area of the computing component,
information detected by the first sensor circuit or the second sensor circuit, or both, or
testing information obtained from analysis of the circuit portion area or the computing component, or both, or any combination thereof.

22. The system of claim 18, wherein the voltage management circuitry is configured to:
receive signaling indicative of the voltage, the current, the temperature, or any combination thereof, associated with the circuit portion area from the first sensor; and
receive signaling indicative of the quality characteristic associated with the circuit portion area from third sensor.

23. The system of claim 18, wherein the voltage management circuitry is configured to:
- receive signaling indicative of the voltage, the current, the temperature, or any combination thereof, associated with the computing component from the second sensor; and
- receive signaling indicative of the quality characteristic associated with the computing component from a fourth sensor.

* * * * *